(12) United States Patent
Huang (10) Patent No.: US 10,977,972 B2
(45) Date of Patent: Apr. 13, 2021

(54) SIGNAL MEASUREMENT CIRCUIT AND MEASUREMENT METHOD THEREFOR

(71) Applicant: HKC Corporation Limited, Shenzhen (CN)

(72) Inventor: Xiaoyu Huang, Shenzhen (CN)

(73) Assignee: HKC Corporation Limited, Guangdong (CN)

( * ) Notice: Subject to any disclaimer, the term of this patent is extended or adjusted under 35 U.S.C. 154(b) by 119 days.

(21) Appl. No.: 16/329,040

(22) PCT Filed: Nov. 21, 2018

(86) PCT No.: PCT/CN2018/116595
§ 371 (c)(1),
(2) Date: Feb. 27, 2019

(87) PCT Pub. No.: WO2020/093449
PCT Pub. Date: May 14, 2020

(65) Prior Publication Data
US 2020/0152102 A1  May 14, 2020

(30) Foreign Application Priority Data

Nov. 9, 2018 (CN) .......................... 2018 1 1332322

(51) Int. Cl.
*G09G 3/00* (2006.01)
*H03K 17/0412* (2006.01)
(Continued)

(52) U.S. Cl.
CPC .......... *G09G 3/006* (2013.01); *G09G 3/3677* (2013.01); *G09G 3/3688* (2013.01);
(Continued)

(58) Field of Classification Search
CPC .... G09G 3/006; G09G 3/3648; G09G 3/2003; G09G 2320/0223; G09G 2300/0426;
(Continued)

(56) References Cited

U.S. PATENT DOCUMENTS 9,671,479 B2 *  6/2017  Blakes ............... G01R 33/3875
2014/0069793 A1 *  3/2014  Ely ........................ H01H 13/85
200/5 A (Continued)

FOREIGN PATENT DOCUMENTS

CN  103593077 A  2/2014
CN  103926761 A  7/2014
(Continued)

OTHER PUBLICATIONS

International Search Report for Application PCT/CN2018/116595 dated Jun. 27, 2019.

*Primary Examiner* — Alvaro E Fortich
*Assistant Examiner* — Zannatul Ferdous
(74) *Attorney, Agent, or Firm* — Muncy, Geissler, Olds & Lowe, P.C.

(57) ABSTRACT

This application provides a signal measurement circuit and a measurement method therefor. The signal measurement circuit is separately connected to a scan line and a data line by using a shim, to measure waveform signals of the scan line and the data line.

18 Claims, 5 Drawing Sheets

(51) Int. Cl.
*H03K 17/785* (2006.01)
*G09G 3/36* (2006.01)

(52) U.S. Cl.
CPC ..... *H03K 17/04123* (2013.01); *H03K 17/785* (2013.01); *G09G 2330/12* (2013.01)

(58) Field of Classification Search
CPC .......... G09G 2300/0408; G02F 1/1368; G02F 1/136286; G02F 1/1309
See application file for complete search history.

(56) References Cited

U.S. PATENT DOCUMENTS

| | | | | |
|---|---|---|---|---|
| 2015/0077681 | A1* | 3/2015 | Li | G09G 3/36 349/47 |
| 2016/0246145 | A1* | 8/2016 | Du | G02F 1/1333 |
| 2020/0152103 | A1* | 5/2020 | Huang | G02F 1/136286 |

FOREIGN PATENT DOCUMENTS

| | | | |
|---|---|---|---|
| CN | 104062784 | A | 9/2014 |
| CN | 108597424 | A | 9/2018 |
| CN | 109243348 | A | 1/2019 |
| CN | 109243350 | A | 1/2019 |
| CN | 109493768 | A | 3/2019 |
| KR | 20080033706 | A | 4/2008 |

\* cited by examiner

SIGNAL MEASUREMENT CIRCUIT AND MEASUREMENT METHOD THEREFOR

BACKGROUND

Technical Field

This application relates to the display field, and in particular, to a signal measurement circuit and a measurement method therefor.

Related Art

A liquid crystal display (LCD) is a flat-panel displaying apparatus displaying an image by using a feature of a liquid crystal material. Compared with another display apparatus, the LCD has advantages such as lightness and thinness, a low drive voltage, and low power consumption.

In addition, a liquid crystal display device usually has a gate driving circuit, a source driving circuit, and a pixel array. The pixel array has a plurality of pixel circuits. Each pixel circuit is opened and closed based on a scan signal provided by the gate driving circuit, and displays a data picture based on a data signal provided by the source driving circuit.

A thin film transistor liquid crystal display (TFT-LCD) is one of main types of current flat-panel displays, and has become an important display platform in modern information science and technology products and videoconferencing products. A main driving principle of the TFT-LCD is: A system main board connects a compression signal, a control signal, and a power supply of a red/green/blue picture element to a connector on a printed circuit board by using wires; after being processed by a timing controller (TCON) chip on the printed circuit board, data passes through the printed circuit board, and is connected to a display area by using a source-chip on film (S-COF) and a gate-chip on film (G-COF); and a voltage is transmitted by using a data line and a scan line on an array substrate, to enable a display panel to implement a display function.

There are capacitance and resistance in wiring on the array substrate, and consequently a signal is distorted after being transmitted by using the data line and the scan line. During a process of product development and subsequent parsing, a voltage signal attenuated after being transmitted by using the data line and the scan line on the array substrate often needs to be measured. In actual application, because ends of the data line and the scan line are located on an edge of glass, the measurement can be performed only after glass splintering. This method requires a relatively long time; and after the glass splintering, a product is damaged, causing wastes, and splinters cause liquid crystals to volatilize. After being inhaled into a human body, the liquid crystals are harmful to health.

Therefore, a main objective of this application is to provide a signal measurement circuit and a measurement method therefor, to implement further optimization for the problem mentioned above.

SUMMARY

To resolve the foregoing technical problem, an objective of this application is to provide a signal measurement circuit, comprising: a first switch, wherein a control end of the first switch is electrically coupled to a first node, a first end of the first switch is electrically coupled to a second node, and a second end of the first switch is electrically coupled to a third node; a second switch, wherein a control end of the second switch is electrically coupled to the first node, a first end of the second switch is electrically coupled to a fourth node, and a second end of the second switch is electrically coupled to the third node; a third switch, wherein a control end of the third switch is electrically coupled to a fifth node, a first end of the third switch is electrically coupled to the third node, and a second end of the third switch is electrically coupled to a shim; a fourth switch, wherein a control end of the fourth switch is electrically coupled to the fifth node, a first end of the fourth switch is electrically coupled to a data line, and a second end of the fourth switch is electrically coupled to the second node; and a fifth switch, wherein a control end of the fifth switch is electrically coupled to the fifth node, a first end of the fifth switch is electrically coupled to a scan line, and a second end of the fifth switch is electrically coupled to the fourth node.

Another objective of this application is to provide a signal measurement circuit, comprising: a first switch, wherein a control end of the first switch is electrically coupled to a first node, a first end of the first switch is electrically coupled to a second node, and a second end of the first switch is electrically coupled to a third node; a second switch, wherein a control end of the second switch is electrically coupled to the first node, a first end of the second switch is electrically coupled to a fourth node, and a second end of the second switch is electrically coupled to the third node; a third switch, wherein a control end of the third switch is electrically coupled to a fifth node, a first end of the third switch is electrically coupled to the third node, and a second end of the third switch is electrically coupled to a shim; a fourth switch, wherein a control end of the fourth switch is electrically coupled to the fifth node, a first end of the fourth switch is electrically coupled to a data line, and a second end of the fourth switch is electrically coupled to the second node; a fifth switch, wherein a control end of the fifth switch is electrically coupled to the fifth node, a first end of the fifth switch is electrically coupled to a scan line, and a second end of the fifth switch is electrically coupled to the fourth node; a sixth switch, wherein a control end of the sixth switch is electrically coupled to a sixth node, a first end of the sixth switch is electrically coupled to the first node, and a second end of the sixth switch is electrically coupled to a first voltage signal; a seventh switch, wherein a control end of the seventh switch is electrically coupled to the sixth node, a first end of the seventh switch is electrically coupled to the first node, and a second end of the seventh switch is grounded; a first resistor, wherein one end of the first resistor is electrically coupled to the first node, and an other end of the first resistor is electrically grounded; a second resistor, wherein one end of the second resistor is electrically coupled to the fifth node, and an other end of the second resistor is electrically grounded; and a third resistor, wherein one end of the third resistor is electrically coupled to a third voltage signal, and an other end of the third resistor is electrically coupled to the first node.

Still another objective of this application is to provide a measurement method for a signal measurement circuit, comprising: providing a first switch, wherein a control end of the first switch is electrically coupled to a first node, a first end of the first switch is electrically coupled to a second node, and a second end of the first switch is electrically coupled to a third node; providing a second switch, wherein a control end of the second switch is electrically coupled to the first node, a first end of the second switch is electrically coupled to a fourth node, and a second end of the second switch is electrically coupled to the third node; providing a third switch, wherein a control end of the third switch is electrically coupled to a fifth node, a first end of the third switch is electrically coupled to the third node, and a second end of the third switch is electrically coupled to a shim; providing a fourth switch, wherein a control end of the fourth switch is electrically coupled to the fifth node, a first end of the fourth switch is electrically coupled to a data line, and a second end of the fourth switch is electrically coupled to the second node; providing a fifth switch, wherein a control end of the fifth switch is electrically coupled to the fifth node, a first end of the fifth switch is electrically coupled to a scan line, and a second end of the fifth switch is electrically coupled to the fourth node; providing a sixth switch, wherein a control end of the sixth switch is electrically coupled to a sixth node, a first end of the sixth switch is electrically coupled to the first node, and a second end of the sixth switch is electrically coupled to a first voltage signal; providing a seventh switch, wherein a control end of the seventh switch is electrically coupled to the sixth node, a first end of the seventh switch is electrically coupled to the first node, and a second end of the seventh switch is grounded; providing a first trigger, wherein a first end of the first trigger is electrically coupled to a second voltage signal, a second end of the first trigger is electrically coupled to a first frequency input signal, and a third end of the first trigger is electrically coupled to the fifth node; providing a second trigger, wherein a first end of the second trigger is electrically coupled to the first node, a second end of the second trigger is electrically coupled to a second frequency input signal, and a third end of the second trigger is electrically coupled to the sixth node; providing a first resistor, wherein one end of the first resistor is electrically coupled to the first node, and an other end of the first resistor is electrically grounded; providing a second resistor, wherein one end of the second resistor is electrically coupled to the fifth node, and an other end of the second resistor is electrically grounded; providing a third resistor, wherein one end of the third resistor is electrically coupled to a third voltage signal, and an other end of the third resistor is electrically coupled to the first node; measuring a waveform signal of a scan line by using a connection between the shim and the scan line; and measuring a waveform signal of a data line by using a connection between the shim and the data line.

The objectives of this application and resolution of the technical problem of this application are implemented by using the following technical solutions.

In an embodiment of this application, polarities of the control ends of the first switch, the third switch, the fourth switch, and the fifth switch are opposite to a polarity of the control end of the second switch.

In an embodiment of this application, the first switch, the third switch, the fourth switch, and the fifth switch are N-type field-effect transistors.

In an embodiment of this application, the second switch is a P-type field-effect transistor.

In an embodiment of this application, a sixth switch is further comprised, wherein a control end of the sixth switch is electrically coupled to a sixth node, a first end of the sixth switch is electrically coupled to the first node, and a second end of the sixth switch is electrically coupled to a first voltage signal.

In an embodiment of this application, a seventh switch is further comprised, wherein a control end of the seventh switch is electrically coupled to the sixth node, a first end of the seventh switch is electrically coupled to the first node, and a second end of the seventh switch is grounded.

In an embodiment of this application, a first trigger is further comprised, wherein a first end of the first trigger is electrically coupled to a second voltage signal, a second end of the first trigger is electrically coupled to a first frequency input signal, and a third end of the first trigger is electrically coupled to the fifth node.

In an embodiment of this application, a second trigger is further comprised, wherein a first end of the second trigger is electrically coupled to the first node, a second end of the second trigger is electrically coupled to a second frequency input signal, and a third end of the second trigger is electrically coupled to the sixth node.

In an embodiment of this application, a first resistor is further comprised, wherein one end of the first resistor is electrically coupled to the first node, and an other end of the first resistor is electrically grounded.

In an embodiment of this application, a second resistor is further comprised, wherein one end of the second resistor is electrically coupled to the fifth node, and an other end of the second resistor is electrically grounded.

In an embodiment of this application, a third resistor is further comprised, wherein one end of the third resistor is electrically coupled to a third voltage signal, and an other end of the third resistor is electrically coupled to the first node.

In an embodiment of this application, according to the measurement method, the step of measuring a waveform signal of a scan line by using a connection between the shim and the scan line comprises: transmitting a high-potential signal to the first trigger and the second trigger, so that a gate control signal of the third switch, the fourth switch, the fifth switch, the sixth switch, and the seventh switch is a high-potential signal, thereby opening the third switch, the fourth switch, the fifth switch, and the seventh switch, and closing the sixth switch; grounding the first resistor, to enable the first node to backhaul a low-potential signal to a first end of the second trigger, so that a gate control signal of the first switch and the second switch is a low-potential signal, thereby closing the first switch and opening the second switch; and measuring the waveform signal of the scan line by using the shim.

In an embodiment of this application, according to the measurement method, the step of measuring a waveform signal of a data line by using a connection between the shim and the data line comprises: transmitting a high-potential signal to the first trigger and the second trigger again, so that a gate control signal of the third switch, the fourth switch, and the fifth switch is a high-potential signal, thereby opening the third switch, the fourth switch, and the fifth switch; enabling a gate control signal of the sixth switch and the seventh switch to be a low-potential signal because the second trigger already receives a low-potential signal backhauled by the first node, thereby opening the sixth switch and closing the seventh switch; transmitting, by the first node, a high-potential signal to a first end of the second trigger in this case, so that a gate control signal of the first switch and the second switch is a high-potential signal, thereby opening the first switch and closing the second switch; and measuring the waveform signal of the data line by using the shim.

This application provides a circuit and a measurement method being capable of quickly measuring a needed signal as required, without affecting product performance and causing additional device costs, to eliminate harm to a human body during a glass splintering process.

DETAILED DESCRIPTION

The following embodiments are described with reference to the accompanying drawings, which are used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

The accompanying drawings and the description are considered to be essentially exemplary, rather than limitative. In the figures, modules with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, an area, and the like are enlarged. In the accompanying drawings, for understanding and ease of description, thicknesses of some layers and areas are enlarged. It should be understood that when a component such as a layer, a film, an area, or a base is described to be "on" "another component", the component may be directly on the another component, or there may be an intermediate component.

In addition, throughout this specification, unless otherwise explicitly described to have an opposite meaning, the word "include" is understood as including the component, but not excluding any other component. In addition, throughout the specification, "on" means that one is located above or below a target component and does not necessarily mean that one is located on the top based on a gravity direction.

To further describe the technical measures taken in this application to achieve the intended application objective and effects thereof, specific implementations, structures, features, and effects of a signal measurement circuit and a measurement method therefor that are provided according to this application are described below in detail with reference to the drawings and preferred embodiments.

Figure 1:
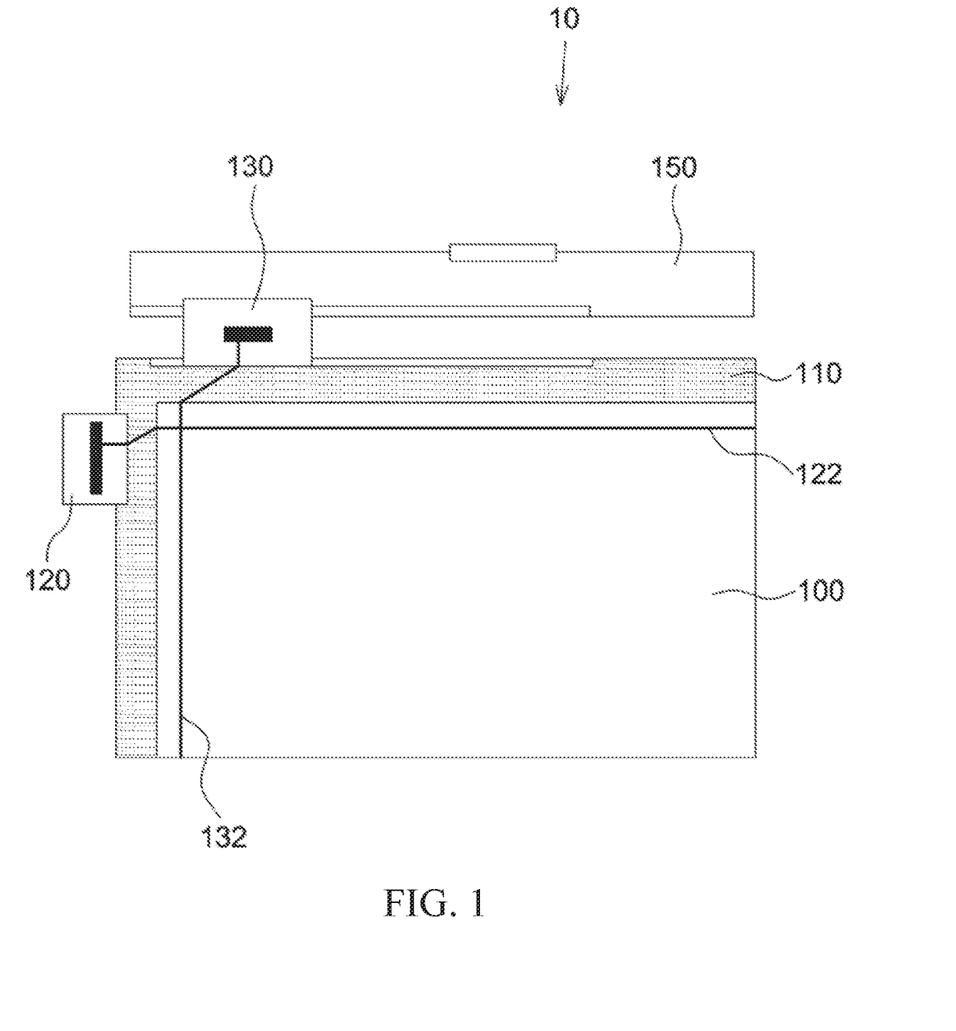
FIG. 1 is a schematic diagram of an exemplary LCD.

FIG. 1 is a schematic diagram of an exemplary LCD. Referring to FIG. 1, an exemplary LCD 10 includes a color filter substrate 100, an array substrate 110, a G-COF 120, an S-COF 130, and a printed circuit board 150. A plurality of scan lines 122 and a plurality of data lines 132 are disposed on the array substrate 110. The scan lines 122 are electrically coupled to the G-COF 120. The data lines 132 are electrically coupled to the S-COF 130.

Figure 2:
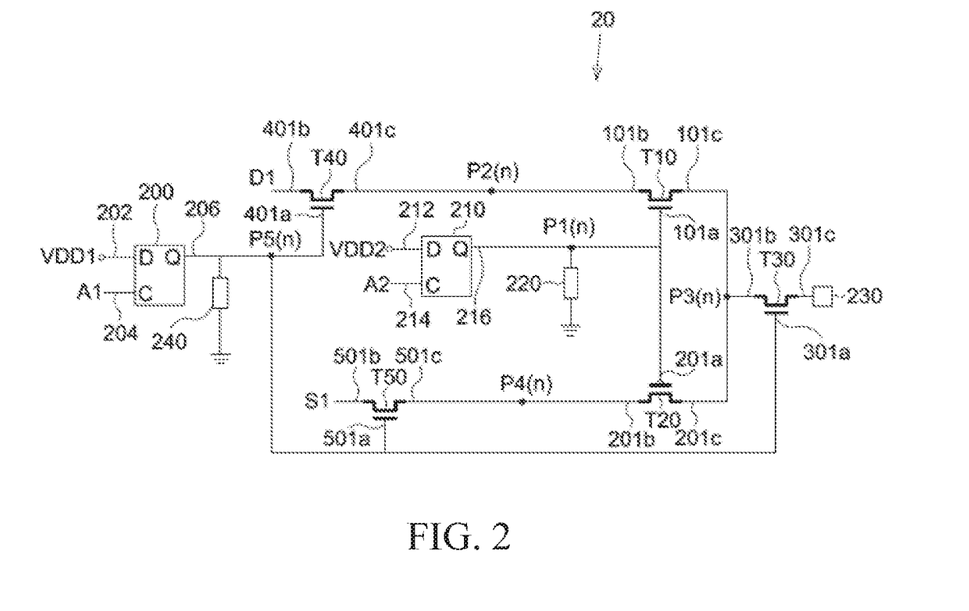
FIG. 2 is a schematic diagram of a signal measurement circuit according to an embodiment of this application.

FIG. 2 is a schematic diagram of a signal measurement circuit according to an embodiment of this application.

Referring to FIG. 2, in an embodiment of this application, a signal measurement circuit 20 includes: a first switch T10, where a control end 101a of the first switch T10 is electrically coupled to a first node P1(n), a first end 101b of the first switch T10 is electrically coupled to a second node P2(n), and a second end 101c of the first switch T10 is electrically coupled to a third node P3(n); a second switch T20, where a control end 201a of the second switch T20 is electrically coupled to the first node P1(n), a first end 201b of the second switch T20 is electrically coupled to a fourth node P4(n), and a second end 201c of the second switch T20 is electrically coupled to the third node P3(n); a third switch T30, where a control end 301a of the third switch T30 is electrically coupled to a fifth node P5(n), a first end 301b of the third switch T30 is electrically coupled to the third node P3(n), and a second end 301c of the third switch T30 is electrically coupled to a shim 230; a fourth switch T40, where a control end 401a of the fourth switch T40 is electrically coupled to the fifth node P5(n), a first end 401b of the fourth switch T40 is electrically coupled to a data line D1, and a second end 401c of the fourth switch T40 is electrically coupled to the second node P2(n); a fifth switch T50, where a control end 501a of the fifth switch T50 is electrically coupled to the fifth node P5(n), a first end 501b of the fifth switch T50 is electrically coupled to a scan line S1, and a second end 501c of the fifth switch T50 is electrically coupled to the fourth node P4(n); a first trigger 200, where a first end 202 of the first trigger 200 is electrically coupled to a first voltage signal VDD1, a second end 204 of the first trigger 200 is electrically coupled to a first frequency input signal A1, and a third end 206 of the first trigger 200 is electrically coupled to the fifth node P5(n); a second trigger 210, where a first end 212 of the second trigger 210 is electrically coupled to a second voltage signal VDD2, a second end 214 of the second trigger 210 is electrically coupled to a second frequency input signal A2, and a third end 216 of the second trigger 210 is electrically coupled to the first node P1(n); a first resistor 220, where one end of the first resistor 220 is electrically coupled to the first node P1(n), and an other end of the first resistor 220 is electrically grounded; and a second resistor 240, where one end of the second resistor 240 is electrically coupled to the fifth node P5(n), and an other end of the second resistor 240 is electrically grounded.

Referring to FIG. 2, in an embodiment of this application, the first switch T10, the third switch T30, the fourth switch T40, and the fifth switch T50 are N-type field-effect transistors; and when a gate control signal thereof is a high-potential signal, the first switch T10, the third switch T30, the fourth switch T40, and the fifth switch T50 are opened; or when a gate control signal thereof is a low-potential signal, the first switch T10, the third switch T30, the fourth switch T40, and the fifth switch T50 are closed.

Referring to FIG. 2, in an embodiment of this application, the second switch T20 is a P-type field-effect transistor; and when a gate control signal thereof is a low-potential signal, the second switch T20 is opened; or when a gate control signal thereof is a high-potential signal, the second switch T20 is closed.

Figure 3:
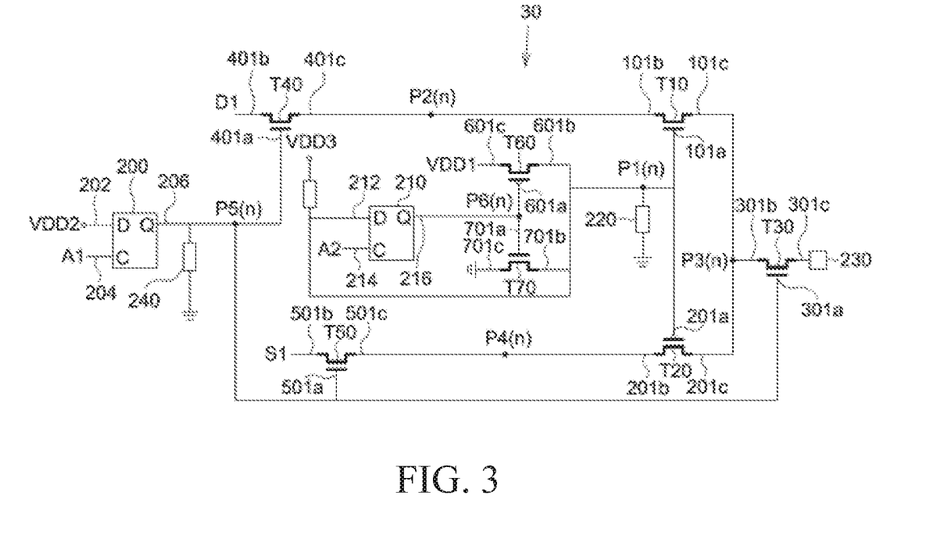
FIG. 3 is a schematic diagram of a signal measurement circuit according to another embodiment of this application.

FIG. 3 is a schematic diagram of a signal measurement circuit according to another embodiment of this application. Referring to FIG. 3, in an embodiment of this application, a signal measurement circuit 30 includes: a first switch T10, where a control end 101a of the first switch T10 is electrically coupled to a first node P1(n), a first end 101b of the first switch T10 is electrically coupled to a second node P2(n), and a second end 101c of the first switch T10 is electrically coupled to a third node P3(n); a second switch T20, where a control end 201a of the second switch T20 is electrically coupled to the first node P1(n), a first end 201b of the second switch T20 is electrically coupled to a fourth node P4(n), and a second end 201c of the second switch T20 is electrically coupled to the third node P3(n); a third switch T30, where a control end 301a of the third switch T30 is electrically coupled to a fifth node P5(n), a first end 301b of the third switch T30 is electrically coupled to the third node P3(n), and a second end 301c of the third switch T30 is electrically coupled to a shim 230; a fourth switch T40, where a control end 401a of the fourth switch T40 is electrically coupled to the fifth node P5(n), a first end 401b of the fourth switch T40 is electrically coupled to a data line D1, and a second end 401c of the fourth switch T40 is electrically coupled to the second node P2(n); a fifth switch T50, where a control end 501a of the fifth switch T50 is electrically coupled to the fifth node P5(n), a first end 501b of the fifth switch T50 is electrically coupled to a scan line S1, and a second end 501c of the fifth switch T50 is electrically coupled to the fourth node P4(n); a sixth switch T60, where a control end 601a of the sixth switch T60 is electrically coupled to a sixth node P6(n), a first end 601b of the sixth switch T60 is electrically coupled to the first node P1(n), and a second end 601c of the sixth switch T60 is electrically coupled to a first voltage signal VDD1; a seventh switch T70, where a control end 701a of the seventh switch T70 is electrically coupled to the sixth node P6(n), a first end 701b of the seventh switch T70 is electrically coupled to the first node P1(n), and a second end 701c of the seventh switch T70 is grounded; a first trigger 200, where a first end 202 of the first trigger 200 is electrically coupled to a second voltage signal VDD2, a second end 204 of the first trigger 200 is electrically coupled to a first frequency input signal A1, and a third end 206 of the first trigger 200 is electrically coupled to the fifth node P5(n); a second trigger 210, where a first end 212 of the second trigger 210 is electrically coupled to the first node P1(n), a second end 214 of the second trigger 210 is electrically coupled to a second frequency input signal A2, and a third end 216 of the second trigger 210 is electrically coupled to the sixth node P6(n); a first resistor 220, where one end of the first resistor 220 is electrically coupled to the first node P1(n), and an other end of the first resistor 220 is electrically grounded; a second resistor 240, where one end of the second resistor 240 is electrically coupled to the fifth node P5(n), and an other end of the second resistor 240 is electrically grounded; and a third resistor 250, where one end of the third resistor 250 is electrically coupled to a third voltage signal VDD3, and an other end of the third resistor 250 is electrically coupled to the first node P1(n).

Referring to FIG. 3, in an embodiment of this application, the first switch T10, the third switch T30, the fourth switch T40, the fifth switch T50, and the seventh switch T70 are N-type field-effect transistors; and when a gate control signal thereof is a high-potential signal, the first switch T10, the third switch T30, the fourth switch T40, the fifth switch T50, and the seventh switch T70 are opened; or when a gate control signal thereof is a low-potential signal, the first switch T10, the third switch T30, the fourth switch T40, the fifth switch T50, and the seventh switch T70 are closed.

Referring to FIG. 3, in an embodiment of this application, the second switch T20 and the sixth switch T60 are P-type field-effect transistors; and when a gate control signal thereof is a low-potential signal, the second switch T20 and the sixth switch T60 are opened; or when a gate control signal thereof is a high-potential signal, the second switch T20 and the sixth switch T60 are closed.

Figure 4:
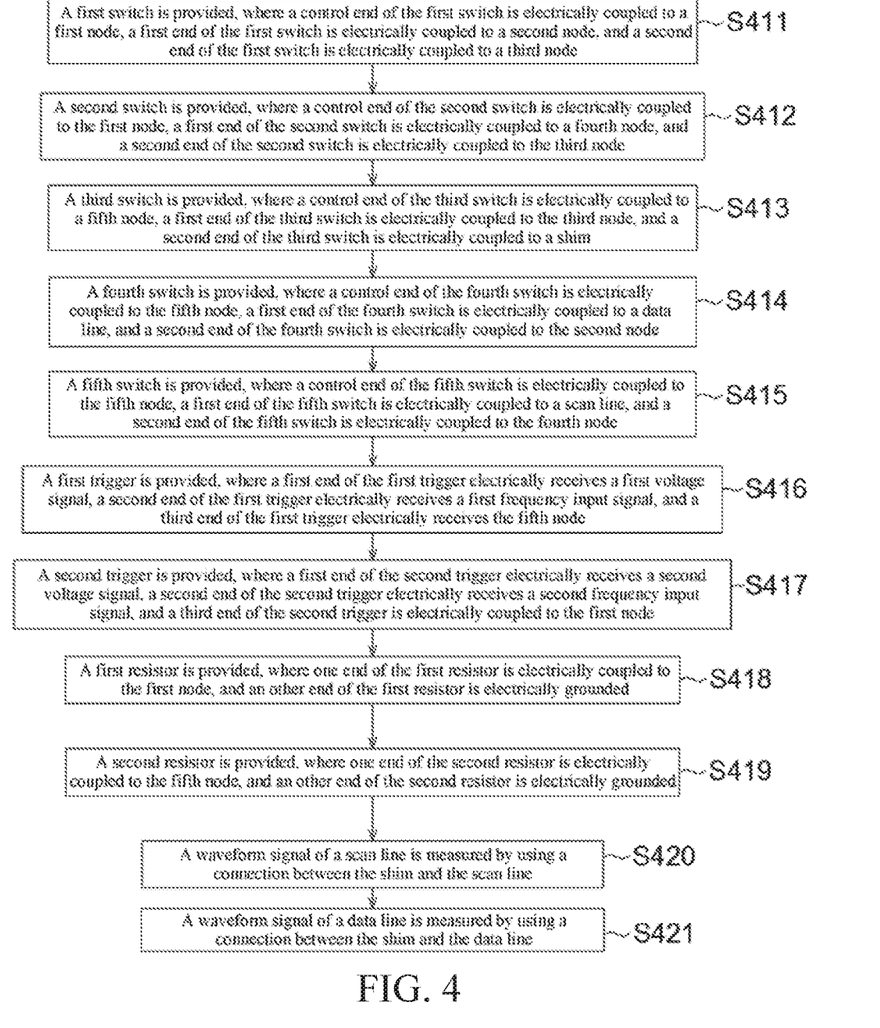
FIG. 4 is a flowchart of a measurement method for a signal measurement circuit according to an embodiment of this application.

FIG. 4 is a flowchart of a measurement method for a signal measurement circuit according to an embodiment of this application. Referring to FIG. 2 and FIG. 4, in an embodiment of this application, a measurement method for a signal measurement circuit 20 includes: providing a first switch T10, where a control end 101a of the first switch T10 is electrically coupled to a first node P1(n), a first end 101b of the first switch T10 is electrically coupled to a second node P2(n), and a second end 101c of the first switch T10 is electrically coupled to a third node P3(n); providing a second switch T20, where a control end 201a of the second switch T20 is electrically coupled to the first node P1(n), a first end 201b of the second switch T20 is electrically coupled to a fourth node P4(n), and a second end 201c of the second switch T20 is electrically coupled to the third node P3(n); providing a third switch T30, where a control end 301a of the third switch T30 is electrically coupled to a fifth node P5(n), a first end 301b of the third switch T30 is electrically coupled to the third node P3(n), and a second end 301c of the third switch T30 is electrically coupled to a shim 230; providing a fourth switch T40, where a control end 401a of the fourth switch T40 is electrically coupled to the fifth node P5(n), a first end 401b of the fourth switch T40 is electrically coupled to a data line D1, and a second end 401c of the fourth switch T40 is electrically coupled to the second node P2(n); providing a fifth switch T50, where a control end 501a of the fifth switch T50 is electrically coupled to the fifth node P5(n), a first end 501b of the fifth switch T50 is electrically coupled to a scan line S1, and a second end 501c of the fifth switch T50 is electrically coupled to the fourth node P4(n); providing a first trigger 200, where a first end 202 of the first trigger 200 is electrically coupled to a first voltage signal VDD1, a second end 204 of the first trigger 200 is electrically coupled to a first frequency input signal A1, and a third end 206 of the first trigger 200 is electrically coupled to the fifth node P5(n); providing a second trigger 210, where a first end 212 of the second trigger 210 is electrically coupled to a second voltage signal VDD2, a second end 214 of the second trigger 210 is electrically coupled to a second frequency input signal A2, and a third end 216 of the second trigger 210 is electrically coupled to the first node P1(n); providing a first resistor 220, where one end of the first resistor 220 is electrically coupled to the first node P1(n), and an other end of the first resistor 220 is electrically grounded; providing a second resistor 240, where one end of the second resistor 240 is electrically coupled to the fifth node P5(n), and an other end of the second resistor 240 is electrically grounded; measuring a waveform signal of a scan line S1 by using a connection between the shim 230 and the scan line S1; and measuring a waveform signal of a data line D1 by using a connection between the shim 230 and the data line D1.

Referring to FIG. 2, in an embodiment of this application, according to the measurement method, the step of measuring a waveform signal of a scan line S1 by using a connection between the shim 230 and the scan line S1 includes: transmitting a high-potential signal (for example, by using a TCON chip on a printed circuit board or an externally supplied signal) to the first trigger 200, so that a gate control signal of the third switch T30, the fourth switch T40, and the fifth switch T50 is a high-potential signal, thereby opening the third switch T30, the fourth switch T40, and the fifth switch T50; grounding the first resistor 220, to enable a gate control signal of the first switch T10 and the second switch T20 to be a low-potential signal, thereby closing the first switch T10 and opening the second switch T20; and measuring the waveform signal of the scan line S1 by using the shim 230.

Referring to FIG. 2, in an embodiment of this application, according to the measurement method, the step of measuring a waveform signal of a data line D1 by using a connection between the shim 230 and the data line D1 includes: transmitting a high-potential signal (for example, by using a TCON chip on a printed circuit board or an externally supplied signal) to the second trigger 210, so that a gate control signal of the first switch T10 and the second switch T20 is a high-potential signal, thereby opening the first switch T10 and closing the second switch T20; and measuring the waveform signal of the data line D1 by using the shim 230.

Referring to FIG. 4, in a procedure S411, a first switch is provided, where a control end of the first switch is electrically coupled to a first node, a first end of the first switch is electrically coupled to a second node, and a second end of the first switch is electrically coupled to a third node.

Referring to FIG. 4, in a procedure S412, a second switch is provided, where a control end of the second switch is electrically coupled to the first node, a first end of the second switch is electrically coupled to a fourth node, and a second end of the second switch is electrically coupled to the third node.

Referring to FIG. 4, in a procedure S413, a third switch is provided, where a control end of the third switch is electrically coupled to a fifth node, a first end of the third switch is electrically coupled to the third node, and a second end of the third switch is electrically coupled to a shim.

Referring to FIG. 4, in a procedure S414, a fourth switch is provided, where a control end of the fourth switch is electrically coupled to the fifth node, a first end of the fourth switch is electrically coupled to a data line, and a second end of the fourth switch is electrically coupled to the second node.

Referring to FIG. 4, in a procedure S415, a fifth switch is provided, where a control end of the fifth switch is electrically coupled to the fifth node, a first end of the fifth switch is electrically coupled to a scan line, and a second end of the fifth switch is electrically coupled to the fourth node.

Referring to FIG. 4, in a procedure S416, a first trigger is provided, where a first end of the first trigger is electrically coupled to a first voltage signal, a second end of the first trigger is electrically coupled to a first frequency input signal, and a third end of the first trigger is electrically coupled to the fifth node.

Referring to FIG. 4, in a procedure S417, a second trigger is provided, where a first end of the second trigger is electrically coupled to a second voltage signal, a second end of the second trigger is electrically coupled to a second frequency input signal, and a third end of the second trigger is electrically coupled to the first node.

Referring to FIG. 4, in a procedure S418, a first resistor is provided, where one end of the first resistor is electrically coupled to the first node, and an other end of the first resistor is electrically grounded.

Referring to FIG. 4, in a procedure S419, a second resistor is provided, where one end of the second resistor is electrically coupled to the fifth node, and an other end of the second resistor is electrically grounded.

Referring to FIG. 4, in a procedure S420, a waveform signal of a scan line is measured by using a connection between the shim and the scan line.

Referring to FIG. 4, in a procedure S421, a waveform signal of a data line is measured by using a connection between the shim and the data line.

Figure 5:
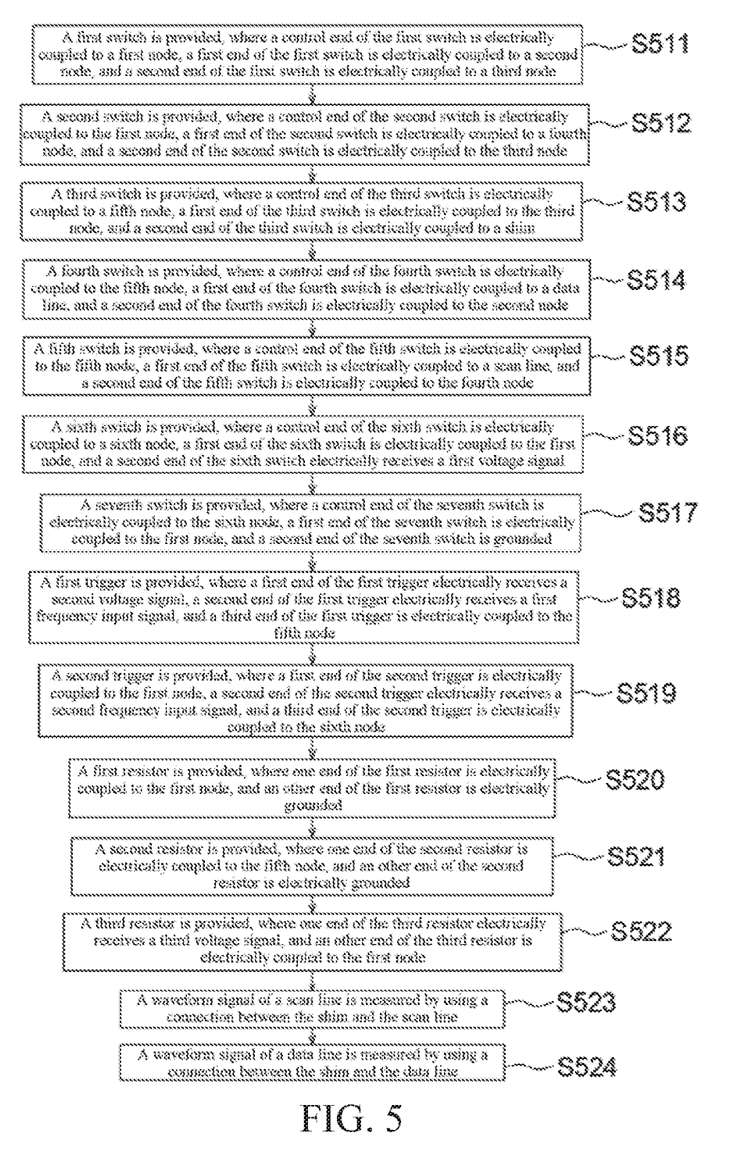
FIG. 5 is a flowchart of a measurement method for a signal measurement circuit according to another embodiment of this application.

FIG. 5 is a flowchart of a measurement method for a signal measurement circuit according to an embodiment of this application. Referring to FIG. 3 and FIG. 5, in an embodiment of this application, a measurement method for a signal measurement circuit 30 includes: providing a first switch T10, where a control end 101a of the first switch T10 is electrically coupled to a first node P1(n), a first end 101b of the first switch T10 is electrically coupled to a second node P2(n), and a second end 101c of the first switch T10 is electrically coupled to a third node P3(n); providing a second switch T20, where a control end 201a of the second switch T20 is electrically coupled to the first node P1(n), a first end 201b of the second switch T20 is electrically coupled to a fourth node P4(n), and a second end 201c of the second switch T20 is electrically coupled to the third node P3(n); providing a third switch T30, where a control end 301a of the third switch T30 is electrically coupled to a fifth node P5(n), a first end 301b of the third switch T30 is electrically coupled to the third node P3(n), and a second end 301c of the third switch T30 is electrically coupled to a shim 230; providing a fourth switch T40, where a control end 401a of the fourth switch T40 is electrically coupled to the fifth node P5(n), a first end 401b of the fourth switch T40 is electrically coupled to a data line D1, and a second end 401c of the fourth switch T40 is electrically coupled to the second node P2(n); providing a fifth switch T50, where a control end 501a of the fifth switch T50 is electrically coupled to the fifth node P5(n), a first end 501b of the fifth switch T50 is electrically coupled to a scan line S1, and a second end 501c of the fifth switch T50 is electrically coupled to the fourth node P4(n); providing a sixth switch T60, where a control end 601a of the sixth switch T60 is electrically coupled to a sixth node P6(n), a first end 601b of the sixth switch T60 is electrically coupled to the first node P1(n), and a second end 601c of the sixth switch T60 is electrically coupled to a first voltage signal VDD1; providing a seventh switch T70, where a control end 701a of the seventh switch T70 is electrically coupled to the sixth node P6(n), a first end 701b of the seventh switch T70 is electrically coupled to the first node P1(n), and a second end 701c of the seventh switch T70 is grounded; providing a first trigger 200, where a first end 202 of the first trigger 200 is electrically coupled to a second voltage signal VDD2, a second end 204 of the first trigger 200 is electrically coupled to a first frequency input signal A1, and a third end 206 of the first trigger 200 is electrically coupled to the fifth node P5(n); providing a second trigger 210, where a first end 212 of the second trigger 210 is electrically coupled to the first node P1(n), a second end 214 of the second trigger 210 is electrically coupled to a second frequency input signal A2, and a third end 216 of the second trigger 210 is electrically coupled to the sixth node P6(n); providing a first resistor 220, where one end of the first resistor 220 is electrically coupled to the first node P1(n), and an other end of the first resistor 220 is electrically grounded; providing a second resistor 240, where one end of the second resistor 240 is electrically coupled to the fifth node P5(n), and an other end of the second resistor 240 is electrically grounded; providing a third resistor 250, where one end of the third resistor 250 is electrically coupled to a third voltage signal VDD3, and an other end of the third resistor 250 is electrically coupled to the first node P1(n); measuring a waveform signal of a scan line S1 by using a connection between the shim 230 and the scan line S1; and measuring a waveform signal of a data line D1 by using a connection between the shim 230 and the data line D1.

Referring to FIG. 3, in an embodiment of this application, according to the measurement method, the step of measuring a waveform signal of a scan line S1 by using a connection between the shim 230 and the scan line S1 includes: transmitting a high-potential signal (for example, by using a TCON chip on a printed circuit board or an externally supplied signal) to the first trigger 200 and the second trigger 210, so that a gate control signal of the third switch T30, the fourth switch T40, the fifth switch T50, the sixth switch T60, and the seventh switch T70 is a high-potential signal, thereby opening the third switch T30, the fourth switch T40, the fifth switch T50, and the seventh switch T70, and closing the sixth switch T60; grounding the first resistor 220, to enable the first node P1(n) to backhaul a low-potential signal to a first end 212 of the second trigger 210, so that a gate control signal of the first switch T10 and the second switch T20 is a low-potential signal, thereby closing the first switch T10 and opening the second switch T20; and measuring the waveform signal of the scan line S1 by using the shim 230.

Referring to FIG. 3, in an embodiment of this application, according to the measurement method, the step of measuring a waveform signal of a data line D1 by using a connection between the shim 230 and the data line D1 includes: transmitting a high-potential signal (for example, by using a TCON chip on a printed circuit board or an externally supplied signal) to the first trigger 200 and the second trigger 210 again, so that a gate control signal of the third switch T30, the fourth switch T40, and the fifth switch T50 is a high-potential signal, thereby opening the third switch T30, the fourth switch T40, and the fifth switch T50; enabling a gate control signal of the sixth switch T60 and the seventh switch T70 to be a low-potential signal because the second trigger 210 already receives a low-potential signal backhauled by the first node P1(n), thereby opening the sixth switch T60 and closing the seventh switch T70; transmitting, by the first node P1(n), a high-potential signal to a first end 212 of the second trigger 210 in this case, so that a gate control signal of the first switch T10 and the second switch T20 is a high-potential signal, thereby opening the first switch T10 and closing the second switch T20; and measuring the waveform signal of the data line D1 by using the shim 230.

Referring to FIG. 5, in a procedure S511, a first switch is provided, where a control end of the first switch is electrically coupled to a first node, a first end of the first switch is electrically coupled to a second node, and a second end of the first switch is electrically coupled to a third node.

Referring to FIG. 5, in a procedure S512, a second switch is provided, where a control end of the second switch is electrically coupled to the first node, a first end of the second switch is electrically coupled to a fourth node, and a second end of the second switch is electrically coupled to the third node.

Referring to FIG. 5, in a procedure S513, a third switch is provided, where a control end of the third switch is electrically coupled to a fifth node, a first end of the third switch is electrically coupled to the third node, and a second end of the third switch is electrically coupled to a shim.

Referring to FIG. 5, in a procedure S514, a fourth switch is provided, where a control end of the fourth switch is electrically coupled to the fifth node, a first end of the fourth switch is electrically coupled to a data line, and a second end of the fourth switch is electrically coupled to the second node.

Referring to FIG. 5, in a procedure S515, a fifth switch is provided, where a control end of the fifth switch is electrically coupled to the fifth node, a first end of the fifth switch is electrically coupled to a scan line, and a second end of the fifth switch is electrically coupled to the fourth node.

Referring to FIG. 5, in a procedure S516, a sixth switch is provided, where a control end of the sixth switch is electrically coupled to a sixth node, a first end of the sixth switch is electrically coupled to the first node, and a second end of the sixth switch is electrically coupled to a first voltage signal.

Referring to FIG. 5, in a procedure S517, a seventh switch is provided, where a control end of the seventh switch is electrically coupled to the sixth node, a first end of the seventh switch is electrically coupled to the first node, and a second end of the seventh switch is grounded.

Referring to FIG. 5, in a procedure S518, a first trigger is provided, where a first end of the first trigger is electrically coupled to a second voltage signal, a second end of the first trigger is electrically coupled to a first frequency input signal, and a third end of the first trigger is electrically coupled to the fifth node.

Referring to FIG. 5, in a procedure S519, a second trigger is provided, where a first end of the second trigger is electrically coupled to the first node, a second end of the second trigger is electrically coupled to a second frequency input signal, and a third end of the second trigger is electrically coupled to the sixth node.

Referring to FIG. 5, in a procedure S520, a first resistor is provided, where one end of the first resistor is electrically coupled to the first node, and an other end of the first resistor is electrically grounded.

Referring to FIG. 5, in a procedure S521, a second resistor is provided, where one end of the second resistor is electrically coupled to the fifth node, and an other end of the second resistor is electrically grounded.

Referring to FIG. 5, in a procedure S522, a third resistor is provided, where one end of the third resistor is electrically coupled to a third voltage signal, and an other end of the third resistor is electrically coupled to the first node.

Referring to FIG. 5, in a procedure S523, a waveform signal of a scan line is measured by using a connection between the shim and the scan line.

Referring to FIG. 5, in a procedure S524, a waveform signal of a data line is measured by using a connection between the shim and the data line.

This application provides a circuit and a measurement method being capable of quickly measuring a needed signal as required, without affecting product performance and causing additional device costs, to eliminate harm to a human body during a glass splintering process.

The wordings such as "in some embodiments" and "in various embodiments" are repeatedly used. The wordings usually refer to different embodiments, but they may also refer to a same embodiment. The words, such as "comprise", "have", and "include", are synonyms, unless other meanings are indicated in the context thereof.

The foregoing descriptions are merely embodiments of this application, and are not intended to limit this application in any form. Although this application has been disclosed above through the preferred embodiments, the embodiments are not intended to limit this application. Any person skilled in the art can make some variations or modifications, which are equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. A signal measurement circuit, comprising:
a first switch, wherein a control end of the first switch is electrically coupled to a first node, a first end of the first switch is electrically coupled to a second node, and a second end of the first switch is electrically coupled to a third node;
a second switch, wherein a control end of the second switch is electrically coupled to the first node, a first end of the second switch is electrically coupled to a fourth node, and a second end of the second switch is electrically coupled to the third node;
a third switch, wherein a control end of the third switch is electrically coupled to a fifth node, a first end of the third switch is electrically coupled to the third node, and a second end of the third switch is electrically coupled to a shim;
a fourth switch, wherein a control end of the fourth switch is electrically coupled to the fifth node, a first end of the fourth switch is electrically coupled to a data line, and a second end of the fourth switch is electrically coupled to the second node;
a fifth switch, wherein a control end of the fifth switch is electrically coupled to the fifth node, a first end of the fifth switch is electrically coupled to a scan line, and a second end of the fifth switch is electrically coupled to the fourth node;
a sixth switch, wherein a control end of the sixth switch is electrically coupled to a sixth node, a first end of the sixth switch is electrically coupled to the first node, and a second end of the sixth switch is electrically coupled to a first voltage signal; and
a seventh switch, wherein a control end of the seventh switch is electrically coupled to the sixth node, a first end of the seventh switch is electrically coupled to the first node, and a second end of the seventh switch is grounded.

2. The signal measurement circuit according to claim 1, wherein polarities of the control ends of the first switch, the third switch, the fourth switch, and the fifth switch are opposite to a polarity of the control end of the second switch.

3. The signal measurement circuit according to claim 2, wherein the first switch, the third switch, the fourth switch, and the fifth switch are N-type field-effect transistors.

4. The signal measurement circuit according to claim 3, wherein the second switch is a P-type field-effect transistor.

5. The signal measurement circuit according to claim 1, further comprising a first trigger, wherein a first end of the first trigger is electrically coupled to a second voltage signal, a second end of the first trigger is electrically coupled to a first frequency input signal, and a third end of the first trigger is electrically coupled to the fifth node.

6. The signal measurement circuit according to claim 1, further comprising a second trigger, wherein a first end of the second trigger is electrically coupled to the first node, a second end of the second trigger is electrically coupled to a second frequency input signal, and a third end of the second trigger is electrically coupled to the sixth node.

7. The signal measurement circuit according to claim 1, further comprising a first resistor, wherein one end of the first resistor is electrically coupled to the first node, and an other end of the first resistor is electrically grounded.

8. The signal measurement circuit according to claim 1, further comprising a second resistor, wherein one end of the second resistor is electrically coupled to the fifth node, and an other end of the second resistor is electrically grounded.

9. The signal measurement circuit according to claim 1, further comprising a third resistor, wherein one end of the third resistor is electrically coupled to a third voltage signal, and an other end of the third resistor is electrically coupled to the first node.

10. A signal measurement circuit, comprising:
a first switch, wherein a control end of the first switch is electrically coupled to a first node, a first end of the first switch is electrically coupled to a second node, and a second end of the first switch is electrically coupled to a third node;
a second switch, wherein a control end of the second switch is electrically coupled to the first node, a first end of the second switch is electrically coupled to a fourth node, and a second end of the second switch is electrically coupled to the third node;
a third switch, wherein a control end of the third switch is electrically coupled to a fifth node, a first end of the third switch is electrically coupled to the third node, and a second end of the third switch is electrically coupled to a shim;
a fourth switch, wherein a control end of the fourth switch is electrically coupled to the fifth node, a first end of the fourth switch is electrically coupled to a data line, and a second end of the fourth switch is electrically coupled to the second node;
a fifth switch, wherein a control end of the fifth switch is electrically coupled to the fifth node, a first end of the fifth switch is electrically coupled to a scan line, and a second end of the fifth switch is electrically coupled to the fourth node;
a sixth switch, wherein a control end of the sixth switch is electrically coupled to a sixth node, a first end of the sixth switch is electrically coupled to the first node, and a second end of the sixth switch is electrically coupled to a first voltage signal;
a seventh switch, wherein a control end of the seventh switch is electrically coupled to the sixth node, a first end of the seventh switch is electrically coupled to the first node, and a second end of the seventh switch is grounded;
a first resistor, wherein one end of the first resistor is electrically coupled to the first node, and an other end of the first resistor is electrically grounded;
a second resistor, wherein one end of the second resistor is electrically coupled to the fifth node, and an other end of the second resistor is electrically grounded; and
a third resistor, wherein one end of the third resistor is electrically coupled to a third voltage signal, and an other end of the third resistor is electrically coupled to the first node.

11. The signal measurement circuit according to claim 10, wherein polarities of the control ends of the first switch, the third switch, the fourth switch, and the fifth switch are opposite to a polarity of the control end of the second switch.

12. The signal measurement circuit according to claim 11, wherein the first switch, the third switch, the fourth switch, and the fifth switch are N-type field-effect transistors.

13. The signal measurement circuit according to claim 12, wherein the second switch is a P-type field-effect transistor.

14. The signal measurement circuit according to claim 10, further comprising a first trigger, wherein a first end of the first trigger is electrically coupled to a second voltage signal, a second end of the first trigger is electrically coupled to a first frequency input signal, and a third end of the first trigger is electrically coupled to the fifth node.

15. The signal measurement circuit according to claim 10, further comprising a second trigger, wherein a first end of the second trigger is electrically coupled to the first node, a second end of the second trigger is electrically coupled to a second frequency input signal, and a third end of the second trigger is electrically coupled to the sixth node.

16. A measurement method for a signal measurement circuit, comprising steps of:
   providing a first switch, wherein a control end of the first switch is electrically coupled to a first node, a first end of the first switch is electrically coupled to a second node, and a second end of the first switch is electrically coupled to a third node;
   providing a second switch, wherein a control end of the second switch is electrically coupled to the first node, a first end of the second switch is electrically coupled to a fourth node, and a second end of the second switch is electrically coupled to the third node;
   providing a third switch, wherein a control end of the third switch is electrically coupled to a fifth node, a first end of the third switch is electrically coupled to the third node, and a second end of the third switch is electrically coupled to a shim;
   providing a fourth switch, wherein a control end of the fourth switch is electrically coupled to the fifth node, a first end of the fourth switch is electrically coupled to a data line, and a second end of the fourth switch is electrically coupled to the second node;
   providing a fifth switch, wherein a control end of the fifth switch is electrically coupled to the fifth node, a first end of the fifth switch is electrically coupled to a scan line, and a second end of the fifth switch is electrically coupled to the fourth node;
   providing a sixth switch, wherein a control end of the sixth switch is electrically coupled to a sixth node, a first end of the sixth switch is electrically coupled to the first node, and a second end of the sixth switch is electrically coupled to a first voltage signal;
   providing a seventh switch, wherein a control end of the seventh switch is electrically coupled to the sixth node, a first end of the seventh switch is electrically coupled to the first node, and a second end of the seventh switch is grounded;
   providing a first trigger, wherein a first end of the first trigger is electrically coupled to a second voltage signal, a second end of the first trigger is electrically coupled to a first frequency input signal, and a third end of the first trigger is electrically coupled to the fifth node;
   providing a second trigger, wherein a first end of the second trigger is electrically coupled to the first node, a second end of the second trigger is electrically coupled to a second frequency input signal, and a third end of the second trigger is electrically coupled to the sixth node;
   providing a first resistor, wherein one end of the first resistor is electrically coupled to the first node, and an other end of the first resistor is electrically grounded;
   providing a second resistor, wherein one end of the second resistor is electrically coupled to the fifth node, and an other end of the second resistor is electrically grounded;
   providing a third resistor, wherein one end of the third resistor is electrically coupled to a third voltage signal, and an other end of the third resistor is electrically coupled to the first node;
   measuring a waveform signal of a scan line by using a connection between the shim and the scan line; and
   measuring a waveform signal of a data line by using a connection between the shim and the data line.

17. The measurement method for a signal measurement circuit according to claim 16, wherein the step of measuring the waveform signal of a scan line by using the connection between the shim and the scan line comprises:
   transmitting a high-potential signal to the first trigger and the second trigger, so that a gate control signal of the third switch, the fourth switch, the fifth switch, the sixth switch, and the seventh switch is the high-potential signal, thereby opening the third switch, the fourth switch, the fifth switch, and the seventh switch, and closing the sixth switch;
   grounding the first resistor, to enable the first node to backhaul a low-potential signal to the first end of the second trigger, so that a gate control signal of the first switch and the second switch is the low-potential signal, thereby closing the first switch and opening the second switch; and
   measuring the waveform signal of the scan line by using the shim.

18. The measurement method for a signal measurement circuit according to claim 16, wherein the step of measuring the waveform signal of a data line by using the connection between the shim and the data line comprises:
   transmitting a high-potential signal to the first trigger and the second trigger again, so that a gate control signal of the third switch, the fourth switch, and the fifth switch is the high-potential signal, thereby opening the third switch, the fourth switch, and the fifth switch;
   enabling a gate control signal of the sixth switch and the seventh switch to be a low-potential signal because the second trigger already receives the low-potential signal backhauled by the first node, thereby opening the sixth switch and closing the seventh switch;
   transmitting, by the first node, the high-potential signal to the first end of the second trigger in this case, so that a gate control signal of the first switch and the second switch is the high-potential signal, thereby opening the first switch and closing the second switch; and
   measuring the waveform signal of the data line by using the shim.

* * * * *